United States Patent [19]

Lechaton et al.

[11] Patent Number: 4,573,256
[45] Date of Patent: Mar. 4, 1986

[54] METHOD FOR MAKING A HIGH PERFORMANCE TRANSISTOR INTEGRATED CIRCUIT

[75] Inventors: John S. Lechaton, Wappingers Falls, N.Y.; Philip M. Pitner, Palo Alto, Calif.; Gurumakonda R. Srinivasan, Poughkeepsie, N.Y.

[73] Assignee: International Business Machines Corporation, Armonk, N.Y.

[21] Appl. No.: 526,849

[22] Filed: Aug. 26, 1983

[51] Int. Cl.[4] .................. H01L 21/265; H01L 21/203; H01L 27/02

[52] U.S. Cl. .................................... 29/576 B; 148/1.5; 148/175; 148/187; 148/DIG. 10; 357/34; 357/91

[58] Field of Search ........ 148/1.5, 187, 175, DIG. 10; 29/576 B; 357/34, 91

[56] References Cited

U.S. PATENT DOCUMENTS

| | | | |
|---|---|---|---|
| 3,640,125 | 3/1972 | Peltzer | 317/235 |
| 4,089,992 | 5/1978 | Doo et al. | 427/94 |
| 4,104,086 | 8/1978 | Bondur et al. | 148/1.5 |
| 4,106,954 | 8/1978 | Brebisson et al. | 148/1.5 |
| 4,111,726 | 9/1978 | Chen | 148/175 |
| 4,157,269 | 6/1979 | Ning et al. | 148/1.5 |
| 4,236,294 | 12/1980 | Anantha et al. | 29/578 |
| 4,318,751 | 3/1982 | Horng | 148/1.5 |
| 4,357,622 | 11/1982 | Magdo et al. | 148/1.5 |
| 4,433,471 | 2/1984 | Ko et al. | 29/578 |
| 4,437,897 | 3/1984 | Kemlage | 148/1.5 |
| 4,481,706 | 11/1984 | Roche | 29/577 C |

OTHER PUBLICATIONS

Dumke IBM-TDB, 26 (1983) 492.

*Primary Examiner*—Upendra Roy
*Attorney, Agent, or Firm*—George O. Saile; T. Rao Coca; Steven J. Meyers

[57] ABSTRACT

A process for making high performance NPN bipolar transistors functioning in a current switch logic circuit. A bipolar transistor is formed within an isolated region of a monocrystalline silicon body. The transistor includes an N+ subcollector, and N+ collector reach-through which connects the subcollector to a major surface of the silicon body, a P base region above the subcollector and adjacent to the reach-through an N+ emitter region within the base region and extending from the major surface. The base region includes an intrinsic base region located below the emitter region and an extrinsic region extending from the major surface and adjacent to the emitter region. The extrinsic base completely surrounds the emitter region. A mask is formed above the major surface having openings only above major portions of the extrinsic base regions. A P+ region is formed in the extrinsic base region by ion implanting with a P type dopant to a depth less than the depth of the N emitter region followed by a short thermal anneal to activate the P dopant. Electrical ohmic contacts are made and the elements are connected in a current switch logic circuit. The use of high conductivity P+ region in the extrinsic base region closely adjacent to the emitter reduces the extrinsic base resistance. Independent doping in the extrinsic base through the mask openings allows independent control of the intrinsic and extrinsic base resistances. These changes increase the performance of bipolar transistor integrated circuits for current switch logic applications.

12 Claims, 5 Drawing Figures

METHOD FOR MAKING A HIGH PERFORMANCE TRANSISTOR INTEGRATED CIRCUIT

DESCRIPTION

1. Technical Field

The invention relates to methods for fabrication of high performance bipolar transistors on an integrated circuit chip and the resulting bipolar transistor.

2. Background Art

Semiconductor integrated circuits have substantially increased in density in the past decade. However, there is an increasing demand for even greater complexities, higher switching speeds and smaller devices for new applications such as microprocessors, minicomputers or the like. It is known that for realizing very high performance transistors, that the transistor device elements must be made more shallow and smaller in size. Two major elements that have been made smaller are the depth of the emitter-base junction and the base width between the emitter-base junction and the base-collector junction. For example, in the N. G. Anantha et al U.S. Pat. No. 4,236,294 and T. H. Ning et al U.S. Pat. No. 4,157,269 and both assigned to the same assignee as the present patent applications there are described methods and resulting structures for forming high performance bipolar transistor integrated circuits. In these patents there are shown methods to form shallow emitters and narrow base width bipolar devices. These patents are exemplary of the use of polycrystalline silicon as the extrinsic base source of P type dopant and the contact for the base region of the bipolar integrated circuit transistor.

The state of the art process technology places present current switch circuit performance in the order of more than about 400 to 500 picoseconds). Further progress in high performance mainframe computers requires delays of the order of two times smaller. Improvements in Very Large Scale Integration (VLSI) high performance devices to obtain such speeds necessitates shallow emitter base profiles which decrease emitter diffusion capacitance; tighter design rules which allow increased packing density and thus reduced interconnect parasitics; and independent control of conductivity properties of intrinsic and extrinsic base which allow decreased base resistance. These process enhancements will allow circuit performance at the level of less than about 300 pico seconds.

It is an object of this invention to describe a new process for making high performance bipolar transistors which allow for both the reduction of the extrinsic base resistance and the emitter area.

It is a further object of this invention to provide a method which allows independent control of the intrinsic and extrinsic base resistances thus allowing vertical scaling of the intrinsic active device without an increase in intrinsic base resistance.

SUMMARY OF THE PRESENT INVENTION

In accordance with the present invention there is described a process for making a high performance NPN bipolar transistor functioning in a current switch logic circuit. A bipolar transistor is formed within an isolated region of a monocrystalline silicon body wherein the transistor includes an N+ subcollector, an N+ collector reach-through which connects the subcollector to a major surface of the silicon body, a P base region above the subcollector and adjacent to the reach-through region, an N+ emitter region within the base region and extending from the major surface. The base region includes an intrinsic base region located below the emitter region and an extrinsic region located extending from the major surface and adjacent to the emitter region. The extrinsic base preferrably completely surrounds or rings the emitter region. A mask is formed above the major surface and the mask has openings therein only in the areas above major portions of the extrinsic base regions. A P+ type region is formed in the extrinsic base region by ion implanting with a P type dopant to a depth of less than the depth of the N emitter region followed by a short thermal anneal to activate the P dopant. Electrical ohmic contacts are made to the elements of the transistor and the elements are connected in a current switch logic circuit. The use of the high conductivity P+ region in the extrinsic base region closely adjacent to the emitter substantially reduces the extrinsic base resistance. Since the extrinsic base region resistance is reduced, it is possible to reduce the size of the emitter area. Independent doping in the extrinsic base through the mask openings also allows independent control of the intrinsic and extrinsic base resistances. The result of these changes substantially increase the performance of bipolar transistor integrated circuits for current switch logic applications.

There is also described a high performance NPN bipolar transistor structure within an integrated circuit structure. The surface region in which the bipolar structure is located is dielectrically isolated from other such regions in the monocrystalline silicon body. An N+ subcollector region is spaced from the isolated region's major surface. An N collector reach-through connects the subcollector to the major surface. A P base region is located above the subcollector region and is adjacent to said reach-through. An N+ emitter region is located within the base region and extends from the major surface. The base region includes an intrinsic base region located below the emitter region and an extrinsic base region located extending from the major surface and adjacent to the emitter region. A P+ region has been formed within the extrinsic base region closely adjacent to the emitter region. Electrical ohmic contacts are made to the collector reach-through, the P+ region in the extrinsic base and the emitter region. The transistor is preferably connected as part of a current switch circuit.

DISCLOSURE OF THE INVENTION

Figure 1:
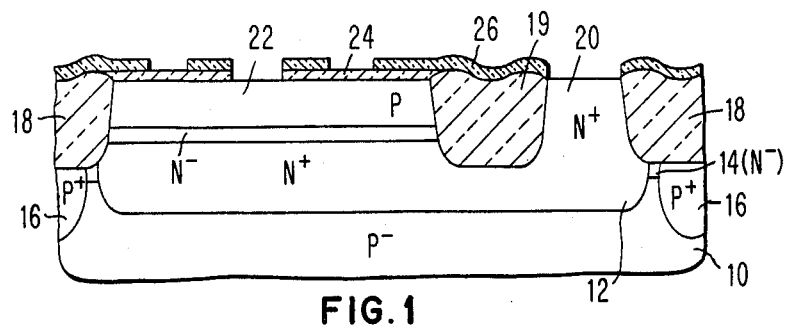
FIGS. 1 through 4 are schematic, greatly enlarged vertical cross-sectional illustrations of one method embodiment for making the high performance bipolar transistor in an integrated circuit.

Referring now more particularly to FIG. 1 there is illustrated the first steps of an embodiment for forming NPN bipolar transistors in an integrated circuit. The FIG. 1 illustrates one small, greatly enlarged portion of the silicon body which will be used to form a very dense, high performance bipolar integrated circuit. A P− substrate of monocrystalline silicon 10 has a N+ subcollector region 12 therein. An epitaxial N− layer 14 is then grown on top of the substrate 10. These processes are standard processes in the formation of, for example, NPN bipolar transistors. The substrate is typically a <100> crystallographic orientation silicon wafer having a resistance of about 10 to 20 ohm/cm. Subcollector diffusion is typically formed using arsenic having a surface concentration of about $1 \times 10^{20}$ atoms/cm$^3$. The epitaxial growth process to form layer 14 may be by conventional techniques, such as the use of silicon tetrachloride/hydrogen or silane/hydrogen mixtures at temperatures of between about 1000° C. to 1200° C. During the epitaxial growth the dopant in the N+ layer moves into the epitaxial layer to fully form the subcollector region 12 as illustrated in FIG. 1. The thickness of the epitaxial layer for highly dense integrated circuits is of the order of 3 micrometers or less. P+ regions 16 can also be formed in the substrate 10 in the designated areas under the recessed silicon dioxide isolating regions 18 which are to be formed. These P+ regions prevent surface inversion and current leakage. A mask, such as a thermally grown silicon dioxide layer (not shown) is formed on the surface of the epitaxial layer 14 and by suitable lithography and etching techniques mask openings are formed therein.

The next series of steps in this embodiment involve the formation of isolation regions of monocrystalline silicon from other regions of monocrystalline silicon. The isolation may be back-biased PN junctions, partial dielectric isolation or complete dielectric isolation. The dielectric materials used may be silicon dioxide, glass, etc. The preferred isolation for highly dense integrated circuits is dielectric isolation. FIG. 1 shows partial dielectric isolation with dielectric regions 18 together with the P+ region 16 isolating monocrystalline silicon regions of the silicon body from one another and region 19 which isolates the base-emitter region from the collector reach-through region. There are many ways in the art to form dielectric isolation regions of this type. It is preferred to use the process described in the Magdo et al patent application Ser. No. 150,609 filed June 7, 1971 or Peltzer U.S. Pat. No. 3,648,125. Alternately, the process described in the J. A. Bondur et al U.S. Pat. No. 4,104,086 can be used. In that patent application and patents the processes for forming partial dielectric isolation for the regions 18 and 19 are described in detail.

The N+ collector reach-through region 20 to subcollector region 12 is formed using standard lithography, etching and diffusion or ion implantation techniques. The region 20 is typically formed with a phosphorus or arsenic dopant.

The P+ base region 22 is formed at this time using silicon dioxide masking with standard lithography, etching and diffusion or ion implantation techniques. It is preferred that the base region butt dielectric isolations 18 and 19, as shown in FIG. 1. The masking lithography layers are then removed. A first insulating layer 24 of silicon dioxide which is preferably thermally grown is formed over the exposed silicon regions. A chemical vapor deposited silicon nitride region 26 is formed over the entire surface of the silicon body as shown in FIG. 1. This insulating combination layer may alternatively be one or a combination of known insulating materials, such as silicon dioxide, silicon nitride, aluminum oxide, or the like, in addition to the thermally grown silicon dioxide. The silicon dioxide layer 24 may be thermally grown in an oxygen or oxygen-water vapor ambient at a temperature of about 925° C. A second method for growing silicon dioxide involves the use of chemical vapor deposition process wherein silane and oxygen are used in the ambient at about 450° C. The silicon nitride layer is formed by chemical vapor deposition usually under the following conditions: silane, ammonia and nitrogen carrier gas at a temperature of about 800° C. under atmospheric or a low pressure conditions as discussed in more detail in the V. Y. Doo U.S. Pat. No. 4,089,992.

The concentration of the base region 22 formed is required to be more than about $1 \times 10^{18}$ atoms/cc and preferably $2 \times 10^{19}$ atoms/cc at the surface. This base region with this conductivity may be formed using either diffusion or ion implantation. The preferred diffusion process uses BBr$_3$ at 875° C. for about 1 hour followed by a base oxidation of thickness 80 nanometers to drive the base into a depth of 0.5 $\mu$m. The ion implant conditions are chosen to produce a similar base profile after oxidation and drive-in. The BBr$_3$ process is preferred over ion implantation process because of reduced damage.

The collector-base junction depth is adjusted to give a final value of 700 nanometers for an emitter depth of 450 nanometers used in this example. These values are for illustration purposes only and can be suitably altered by one skilled in the art to provide base widths of the order of 200 to 300 nanometers. The collector-base junction depth could vary between, for example, about 650 to 750 nanometers. The exact specification of the junction depths is dictated by the required circuit performance.

Figure 2:
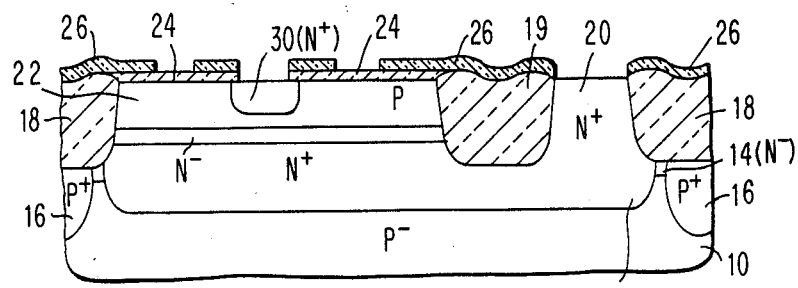

The emitter region 30 is now formed using arsenic capsule diffusion or ion implantation as seen in FIG. 2. The preferred diffusion process conditions are 1000° C. for 120 minutes. To achieve an emitter-base junction depth of 400 to 500 nanometers and base-collector junction, after this temperature cycle, of 700 nanometers. These conditions may be varied to produce the desired transistor structure. This processing results in a base width of about 250 nanometers. However, base widths of 150 to 350 nanometers can readily be fabricated by this process.

The formation of arsenic emitter by ion implantation is an alternative to the diffusion process. An illustrative process uses an implantation energy of 50 KeV with an implantation dosage of about $9.5 \times 10^{15}$ atom/cm$^2$. The screen silicon dioxide thickness used is typically 225 Å. The emitter drive-in heat cycle is about 70 minutes at 1000° C. This ion implantation process can be used to form the same junction depths described in regard to the diffusion process.

The size of the emitter region 30 can be reduced, for example to 3.5×4.0 micrometers squared or less because of the reduced resistance of the extrinsic base that is achieved by the present invention.

A block-out mask 32 is formed by conventional lithography and etching techniques to cover all areas of the integrated circuit except for an annular base region completely surrounding the emitter region 30. It is important to have the block-out mask covering all other areas of the integrated circuit particularly those involving Schottky barrier diode, resistors and the like. The block-out mask can be a 1 to 1.5 micrometer layer of positive or negative resist.

Figure 3:
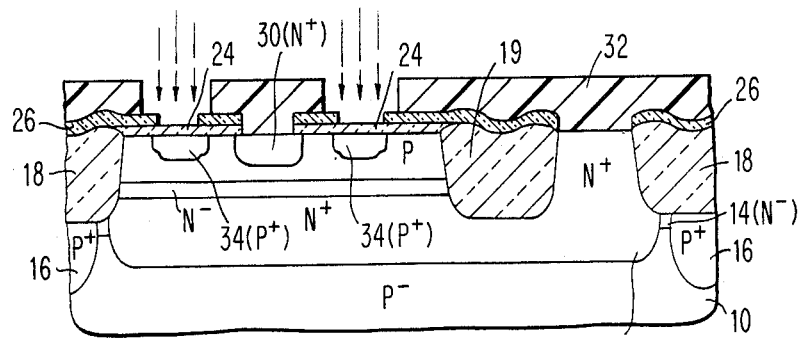

The FIG. 3 structure having a block-out mask 32 is then inserted into an ion implantation apparatus where P+ ions, such as boron, are implanted through mask 32 to form an annular P+ type region 34 in the extrinsic base region. The depth of this region 34 is less than about the depth of the N emitter region 30. The reason for the P+ type region 34 being implanted to a depth which is less than the emitter region 30 is to guarantee that the P+ ions will not approach the collector region during the subsequent thermal activation anneal cycle. Otherwise, the collector to base depletion capacitance would increase and the breakdown voltage would decrease. This would be detrimental to device performance. The preferred depth of the region is between about 0.3 to 0.4 micrometers. This is obtained by using an ion implantation dosage of $8\times10^{15}$ to $1\times10^{16}$ atoms/cm$^2$ at a power of 90 to 110 KeV. It should be noted that the bottom shape of the annular region 34 is non-planar because the ions at the periphery of the opening must pass through the silicon dioxide layer 24. The distance between the annular P+ region 34 and the edge of the emitter region 30 is between about 0.9 to 1.1 micrometers. This dimension is determined by the lithography tolerances and is important because it determines the resistance of the base contact. If the spacing is too small the device emitter-base breakdown voltage and sidewall depletion capacitance is adversely affected. If the spacing is too large, the full performance benefit from the extrinsic base region 34 will not be realized.

The resist block-out mask 32 is now removed by using a conventional removal solution or an oxygen dry etching technique. The P+ ion implanted region is now annealed at a temperature of between about 850° to 950° C. for about 30 to 45 minutes in an oxidizing atmosphere to activate the atoms in the annular region 34. The silicon dioxide screen layer 24 is thickened during this process where it is exposed above the annular extrinsic base region 34 to form silicon dioxide layer 35. The extrinsic base resistance has been reduced by region 34 to less than 100 ohms/square and preferably between about 35 to 60 ohms/square.

Figure 4:
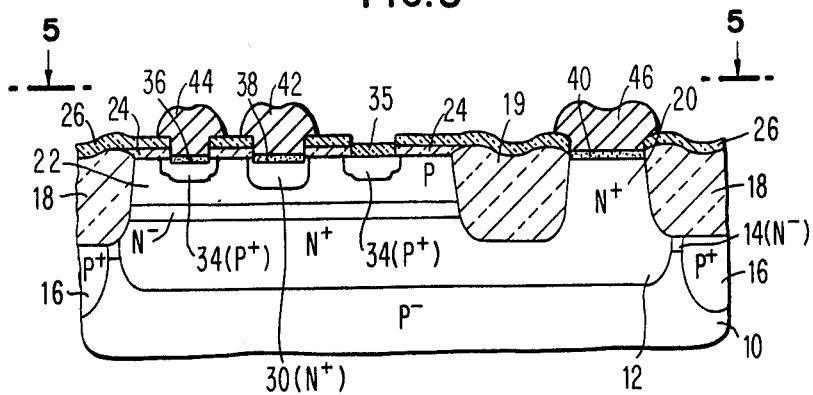
Figure 5:
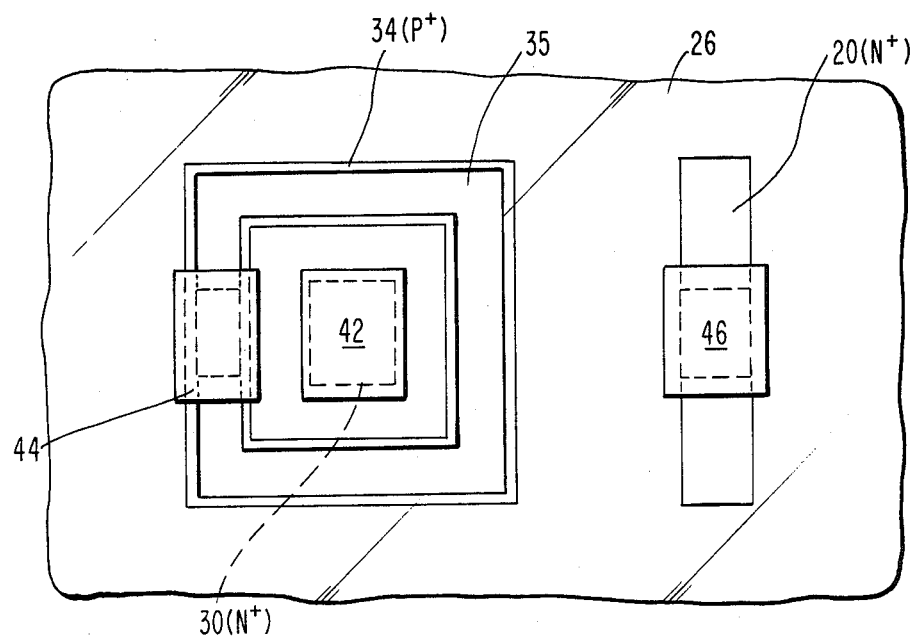
FIG. 5 is a top view of the FIG. 4 structure as seen from the arrows 5:5 of FIG. 4.

Contact openings are made to the emitter region 30, annular P+ region 34 and collector reach-through region 20 through the silicon dioxide layers 24 or 35 by conventional lithography and etching techniques. Only a single base contact 44 is now required versus the two or more contacts made on conventional current switch devices. The extrinsic base is of such low resistivity as compared to the standard diffusion/implant bases that it effectively provides an annular burried contact around the emitter. A blanket layer of platinum, palladium is deposited over the surface. The structure is heated to a temperature of between about 450° to 550° C. for time sufficient to react the platinum or palladium metal in contact with silicon to form a platinum or palladium silicide ohmic contact 36 to the base region, contact 38 to the emitter region, and contact 40 to the collector region. Where the platinum or palladium metal is overlying insulating layer 26, or the like, there is no reaction. The unreacted material is removed by etching with aqua regia chemical solution. A blanket metal layer of a for example transition metal, aluminum, aluminum-copper, or the like, is deposited over the platinum or palladium silicide contacts and the silicon nitride layer. Lithography and etching techniques are used to delineate the blanket metal layer to form the emitter contact 42, base contact 44 and collector contact 46 as shown in FIG. 4. The FIG. 5 illustrates the top view of FIG. 4 as seen from 5:5 of FIG. 4.

The method and resulting structure has numerous features and advantages over present current switch devices and methods for fabricating the same. For example, the reduction of the extrinsic base resistance to a level of less than about 100 ohms/square; the reduction of the emitter size with the closely adjacent highly doped extrinsic base which also decreases the intrinsic base resistance through the reduced emitter geometry factor; the performance enhancement over present bipolar devices by reducing the extrinsic base resistance; and the use of the single base contact allows the device area to be decreased by about 30% below standard double contact double base contact current switch devices and thus could contribute to increased device density. The emitter and base profiles may now be made shallow without the adverse effect of increased intrinsic base resistance, since the extrinsic base implanted resistance acts as an equipotential plane surrounding the emitter.

Current switch circuitry is operated at high emitter current densities to attain optimum performance. At these levels the circuit performance sensitivities to parasitic collector-base and collector-substrate capacitance become less important. Instead, the extrinsic and intrinsic base resistance and emitter diffusion capacitance dominate circuit performance.

The usual method of decreasing emitter diffusion capacitance is to construct shallow emitter and base profiles and lower base doping levels. Unfortunately, this method adversely increases intrinsic base resistance thus decreasing the benefit of decreased diffusion capacitance since circuit performance is directly proportional to the product of the two. The present method and resulting structure allows device scaling to continue without the adverse impact of increasing base resistance.

While the present new process and stucture has the above stated particular advantages for current switch circuits, other circuit families (TTL, RTL, DTL, I$^2$L . . . ) operated at low power levels may benefit from the present process through a lower power-delay product due to decreased collector base, collector substrate capacitance from a single base contact device layout.

While the invention has been particularly shown and described with reference to the preferred embodiments thereof, it will be understood by those skilled in the art that the foregoing and other changes in form and details may be made without departing from the spirit and scope of the invention.

What is claimed is:

1. A method for making a high performance NPN bipolar transistor functioning in a current switch logic circuit comprising:

forming a bipolar transistor within an isolated region of a monocrystalline silicon body wherein said transistor includes an N+ subcollector, a N collector reach-through which connects said subcollector to a major surface of said body, a P base region above said subcollector and adjacent to said reach-through, an N+ emitter region within said base region and extending from said major surface, and wherein said base region includes an intrinsic base region located below said emitter region and an extrinsic base region located extending from said major surface and adjacent to said emitter region;

forming a mask above said major surface which has openings therein only in the areas above major portions of said extrinsic base regions;

forming a P+ region in said extrinsic base region by ion implanting with a P type dopant and to a depth of less than the depth of said N emitter region;

annealing the structure to activate the P type dopant in the P+ region; and making electrical ohmic contact to the elements of said transistor and connecting them in said current switch logic circuit.

2. The method of claim 1 wherein the said intrinsic base region has a dopant concentration of between about $5 \times 10^{18}$ to $5 \times 10^{19}$ boron ions/cc. at the surface.

3. The method of claim 1 wherein said mask is composed of an exposed and developed resist material.

4. The method of claim 1 wherein said emitter-intrinsic base junction is between about 400 to 500 nanometers from said major surface and said extrinsic base-collector junction depth is between about 650 to 750 nanometers.

5. The method of claim 1 wherein said P+ extrinsic base is an annulus shaped region which surrounds the side edge of said emitter region.

6. The method of claim 2 wherein said ion implanting is followed with an annealing at a temperature of between about 850° to 950° C. for a suitable time.

7. The method of claim 6 wherein said P+ region has a dopant concentration of between about $1 \times 10^{20}$ to $1 \times 10^{19}$ boron ions/cc. at the surface and sheet resistivity of less than about 100 ohms/square.

8. The method of claim 7 wherein the said sheet resistivity is between about 35 to 60 ohms/square.

9. The method of claim 5 wherein the spacing of edge of said P+ base adjacent to the said emitter edge is between about 0.6 to 1.1 micrometers.

10. The method of claim 9 wherein the distance between the emitter-intrinsic base junction and intrinsic base collector junction is between about 200 to 300 nanometers.

11. The method of claim 10 wherein said sheet resistivity of said P+ extrinsic base region is between about 35 to 60 ohms/square.

12. The method of claim 11 wherein said electrical ohmic contact to said elements is a metal silicide contact.

* * * * *